(12) United States Patent
Anzai

(10) Patent No.: US 6,459,592 B1
(45) Date of Patent: Oct. 1, 2002

(54) CIRCUIT ASSEMBLY INCLUDING VLSI PACKAGE

(75) Inventor: Yasuhito Anzai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/416,064

(22) Filed: Oct. 12, 1999

(30) Foreign Application Priority Data

Oct. 14, 1998 (JP) ............................................. 10-292527

(51) Int. Cl.[7] ................................................ H05K 7/10
(52) U.S. Cl. ........................ 361/760; 361/767; 361/790; 361/764; 257/737; 257/772; 174/261; 174/34
(58) Field of Search .............................. 361/760, 767, 361/808, 764, 771, 779, 777, 778, 790; 257/737, 778, 772, 780; 228/180.2; 174/261, 34

(56) References Cited

U.S. PATENT DOCUMENTS

| | | | | |
|---|---|---|---|---|
| 5,011,066 A | * | 4/1991 | Thompson | 228/180.2 |
| 5,147,084 A | * | 9/1992 | Behun et al. | 228/56.3 |
| 5,329,423 A | * | 7/1994 | Scholz | 361/760 |
| 5,477,933 A | * | 12/1995 | Nguyen | 361/262 |
| 5,834,848 A | * | 11/1998 | Iwasaki | 257/778 |
| 5,847,456 A | * | 12/1998 | Shoji | 257/737 |
| 5,889,326 A | * | 3/1999 | Tanaka | 257/737 |
| 6,002,172 A | * | 12/1999 | Desai et al. | 257/737 |
| 6,081,038 A | * | 6/2000 | Murayama | 257/783 |
| 6,125,043 A | * | 9/2000 | Hauer et al. | 361/760 |

* cited by examiner

Primary Examiner—David S. Martin
Assistant Examiner—Hung Bui
(74) Attorney, Agent, or Firm—Rabin & Berdo, P.C.

(57) ABSTRACT

A VLSI package assembly comprising a package substrate carrying thereon an IC chip, a mother board supporting thereon the package substrate, and a connection means for providing electric connection between the substrate and the mother board. The connections means has a high durability against stresses thereby to keep its electric connection even in the face of difference in thermal expansions appearing within the package substrate and mother board.

11 Claims, 5 Drawing Sheets

CIRCUIT ASSEMBLY INCLUDING VLSI PACKAGE

BACKGROUND OF THE INVENTION

1. Field of the Invention

The present invention relates to a circuit assembly including a VLSI package in which a package substrate carries an IC chip on one major surface thereof while a plurality of connection pads are provided on the other major surface thereof in a two-dimensional format.

2. Description of the Related Arts

Recently, the degree of integration of the VLSI has been more enhanced and accordingly the number of the connection pins per one IC package substrate has been much increased. The connection pins are formed on the bottom surface of the IC package substrate in a two-dimensional manner so as to suppress the largeness of the size of the package substrate. An example of such a two-dimensional arrangement of the connection pin is the so-called "pin grid array (PGA)". The PGA technique is so effective in enhancing the degree of integration of a VLSI since such technique can avoid the situation in which the pitch between the connection pins becomes too narrow because of the two-dimensional arrangement of the connection terminals.

However, there is still encountered some constructive restrictions such as restriction in the pitch length and difficulty in providing signal lines between the connection pins when the PGA package is to be mounted on a mother board i.e. a printed circuit board, because of restrictions in the mounting arrangement within the mother board.

Therefore, there have been developed the surface mount type PGA, the land grid array (LGA), etc. In the LGA arrangement, no pin is used, but only pads are provided for electric connections to the mother board thereby to avoid the restriction encountered in the PGA assembly. However, the LGA assembly needs connectors, which causes a substantial increase in the size of the overall assembly, and unreliable electric connections.

In order to solve the above-mentioned problem having occurred in the LGA arrangement, there has developed the so-called ball grid array (BGA). In the BGA assembly, a package substrate carrying an IC chip on one major surface thereof is provided on the other surface thereof with a plurality of solder bumps arranged in a two-dimensional manner. The BGA arrangement is advantageous because of its electric characteristics of low capacitance and low inductance, and is welcomed as a package of a low cost.

FIGS. 1A and 1B are respectively sectional and plan views showing an exemplary arrangement including a VLSI package assembly with the BGA. FIGS. 2A through 2C are sectional views each showing in an enlarged scale an electrical connection assembly provided between a package substrate and a mother board.

Referring now to FIG. 1A, there is shown a BGA package 50 which includes an IC chip 51 connected through a plurality of soldering bumps 52 mounted on one major surface of a package (PKG) substrate 53. The IC chip 51 is embedded within a plastic mold 58. On the other major surface of the PKG substrate 53 are formed a plurality of soldering bumps 55 for PKG I/O connection in such a two-dimensional format as shown in FIG. 1B. These soldering bumps 55 interconnect the PKG I/O pads 54 formed on the PKG substrate 53 and the mother board I/O pads 57 as clearly seen from FIG. 2A.

It is, in this instance, to be noted that the surfaces of the PKG I/O pads 54 and the mother board I/O pads 57 may be independently treated through a treatment process such as the normal (continuous current supplied) or flashing (intermittent current supplied) plating process with gold by the respective parts suppliers.

A soldering resist layer 60 covers the major surface of the PKG substrate 53 confronting the mother board 56 but other than central portions of the respective pads 54. A soldering resist layer 61 covers the major surface of the mother board 56 confronting the PKG substrate 53 but other than the central portions of the respective pads 57. These soldering resist layers 60 and 61 are effective for preventing the PKG I/O connection soldering bump 55 from adhering to the PKG substrate and mother board 56.

FIG. 2C is a plan view of the arrangement of FIG. 2A along a line A—A appearing in FIG. 2A. As seen from FIG. 2C, the mother board I/O pad 57 includes a soldering connection part 57a which is to be connected with the soldering bump 55 and an external connection part 57b. It is now to be understood that a central portion of the soldering connection part 57a is exposed to the outside through an aperture 60a of the soldering resist 61 so that the central portion can be connected with the soldering bump 55.

When it is intended to electrically connect the PKG substrate 53 and the motor board 56, they are so positioned relative to each other that the PKG I/O pads 53 and the mother board I/O pads 57 confront each other, respectively and they are temporarily fastened to each other by an appropriate tool (not shown). Thereafter, the soldering bumps 55 are provided through a process such as reflowing process so as to provide electrical connection between the PKG I/O pads 54 and the mother board I/O pads 57.

It is to be noted that the BGA package is subjected to abrupt temperature changes when the PKG substrate 53 and the mother board 56 are electrically connected to each other through the reflowing process of the soldering bumps 55. Furthermore, the BGA package might be used within an apparatus which is subject to such abrupt temperature changes. When the BGA package is used within such apparatus being subject to abrupt temperature changes, there may arise non-uniform temperature distribution because of heat caused by operation of the BGA package. In such situation, various stresses appear within the bumps 55 because of differences in thermal expansion between the PKG package substrate 53 and the mother board 56 and therefore such a problem arises that some connecting areas or portions between the soldering bumps and the pads are peeled off.

On the other hand, the enhancement of the integration degree of the VLSI causes decrease in size of soldering connection part 57a which is shown in FIG. 2C. Thus, the dimension of the connecting area between the soldering bump 55 and the soldering connection part 57a decreases. When such BGA package with such narrow connection areas at the soldering connections is used in an apparatus, such as a portable device, which is subject to shocks because of dropping, the BGA package might be subject to breakage in the electrical connections between the pads 54 and 57.

As shown in more detail in FIG. 2B, it happens because of the abrupt changes in temperature and/or mechanical shocks that a gap 61 appears between the soldering bump 55 and the pad 57 thereby to destroy the electrical connection therebetween.

It is now apparent that there has been such a problem in a prior art package that electrical disconnection is liable to occur between the pads 54 and 57.

OBJECTS AND SUMMARY OF THE INVENTION

Accordingly, an object of the present invention is to provide a VLSI package assembly which can surely keep the electrical connection between the PKG substrate and the mother board while the connection terminals or pads are arranged in a two-dimensional format.

According to the present invention, an improved VLSI package assembly is provided which comprises a PKG substrate carrying on one major surface thereof an IC chip and having a plurality of first connection pads arranged in a two-dimensional format; a mother board having a plurality of second connection pads two-dimensionally arranged on one surface thereof confronting said other surfaced of the PKG substrate; and connection elements electrically connecting between the first and second connection pads, wherein an electric connecting assembly constituted by said first and second connections pads and said connection elements includes an anti-stress structure with a high durability against stresses occurring therein.

According to one aspect of the present invention, one of the first and second pads has a smaller exposed area for soldering than the other in case said one is treated with an electrolytic plating process but the other is treated with a non-electrolytic plating process. With this arrangement, connection strength at the respective connection of the respective first and second connection pads with the soldering elements is kept substantially uniform. This is based on a finding that the solder can adhere to the surface of the connection pad plated with a metal such as gold through the electrolytic process more strongly than to the surface of the connection pads plated with the same metal through the non-electrolytic process.

According to a second aspect of the present invention, there formed a second connection pad on the major surface of the mother board confronting the major surface of the PKG substrate on which a first connection pad is formed and the second connection pad includes a resilient structure. That is, the second connection pad is not separated from the connection element even though a stress appears in the electric connection assembly because of difference in thermal expansion between the PKG substrate and the mother board since the stress is absorbed by the resilient structure. In other words, the electric connection by means of solder between the first and second connection pads is securely kept.

According to a third aspect of the present invention, the resilient structure is constituted by the first and second connections pads and the connection elements such as a solder piece and the second connection pad includes a resilient flat plate which is divided into two pieces.

According to a fourth aspect of the present invention, the resilient structure is constituted by the first and second connection pads and the connection elements and the second connection pad includes a resilient flat plate which is divided into two pieces which are apart from each other.

DETAILED DESCRIPTION OF PREFERRED EMBODIMENTS

Figure 1A:
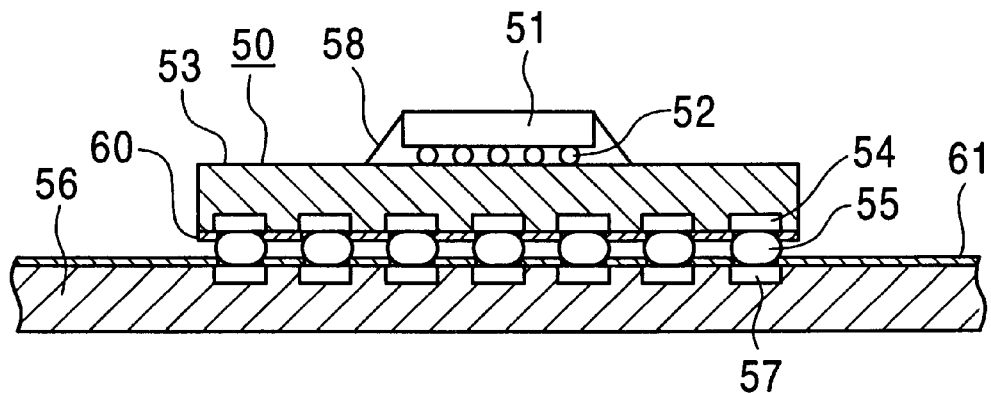
FIGS 1A and 1B are respectively sectional and partial plan views for showing a prior art.

Referring to the drawings, there will be explained in detail preferred embodiments of the present invention in the followings.

Figure 1B:
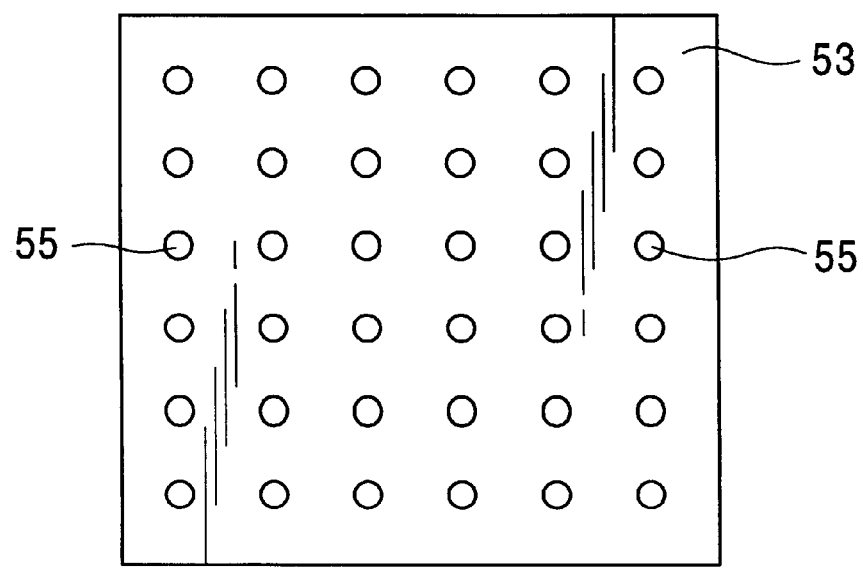
Figure 2A:
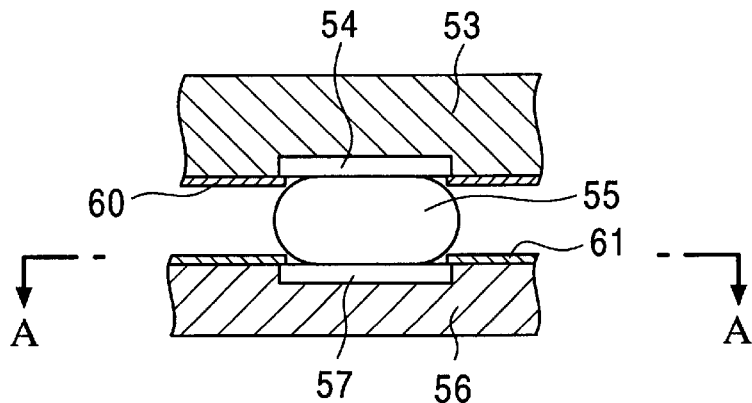
FIGS. 2A and 2B are sectional views each showing a single electric connection arrangement including a solder bump interconnecting I/O pads which are respectively provided on the PKG substrate and the mother board.
Figure 2B:
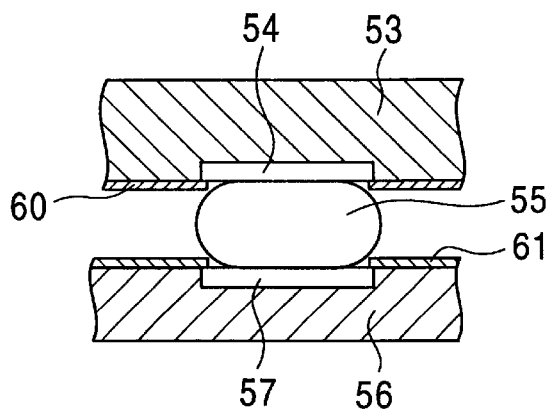
Figure 2C:
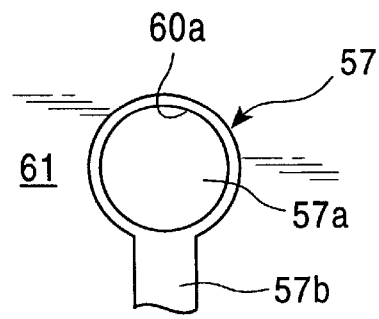
FIG. 2C is a plan view showing a single I/O pad along a line A—A appearing in FIG. 2A.
Figure 3A:
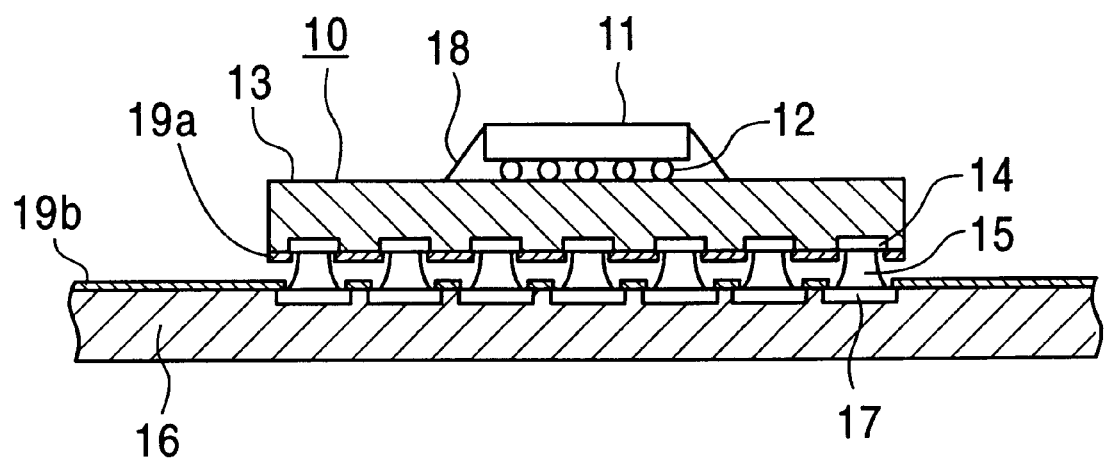
FIG. 3A is a sectional view showing a first embodiment of the present invention.
Figure 3B:
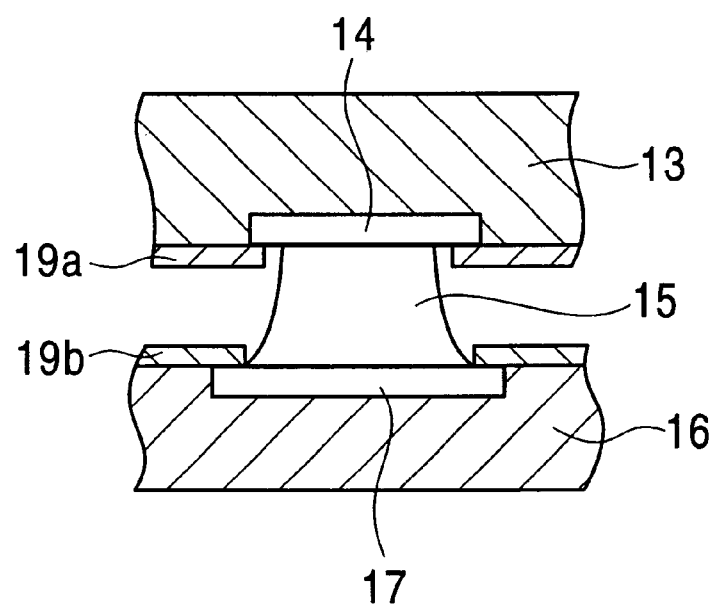
FIG. 3B is a sectional view showing in an enlarged scale a single electric connection arrangement including a solder bump interconnecting pads respectively formed on the PKG substrate and the mother board shown in FIG. 3A.

FIGS. 3A and 3B are sectional views of a VLSI package (BGA package) assembly of a first embodiment according to the present invention. FIG. 3A shows a sectional view of the VLSI package assembly and FIG. 3B is a sectional view showing a part of the VLSI package assembly in an enlarged scale. In this first embodiment, a BGA package 10 includes an IC chip 11 which is mounted on one major surface of a PKG substrate 13 and connected to an electric circuit carried by the substrate 13 through a plurality of solder bump 12. The IC chip 11 is embedded within a plastic mold 18 so as to be sealed from the outside. On the other surface of the other surface of the PKG package 13 there are provided a plurality of I/O connection solder bumps 15 (connection element) in a two-dimensional format as in the BGA package 30 shown in FIG. 1B. As seen from FIGS. 3A and 3B, the I/O connection solder bumps 15 interconnect PKG I/O connection pads (first connection terminals) 14 formed on the PKG substrate 13 and mother board I/O connection pads (second connection terminals) 17 formed on the mother board 16.

It is to be understood that each of the mother board I/O pads 17 has a connection area exposed to the outside through the aperture of the solder resist 60 which is larger than the connection area of the corresponding PKG I/O connection pads 14. In other words, each of the mother board I/O connection pads 17 is connected with the solder bump 15 through a connection area which is wider than that between each of the PKG substrate connection pads 14 and the solder bump 15. In this arrangement, the surfaces of the respective PKG I/O connection pads 14 are already or previously treated by an electrolytic plating process with a metal such as gold. On the other hand, the surfaces of the respective mother board I/O connections pads 17 are already or previously treated by a non-electrolytic plating process with, for example, the same metal as for the pads 14.

In order to define the exposed connection area of each of the PKG I/O pads 14, a solder resist layer 19a is formed on the major surface of the PKG substrate 13 on which the PKG I/O pads 14 are formed. Further, a solder resist layer 19b is formed on the major surface of the mother board 16 on which the mother board I/O connection pads 17 are formed so as to define the exposed connection area of each of the pads 17. It is to be understood that the solder resist layers 19a and 19b prohibit the soldering material from contacting with the surfaces of the PKG substrate 13 and mother board 16 when the solder bumps 15 are formed between the substrate 13 and the board 16.

In the process for providing electrical connections between electric circuits mounted on the PKG substrate 13 and the mother board 16, the PKG substrate 13 is positioned relative to the mother board 16 so that the PKG I/O pads 14 and mother board I/O pads 17 respectively confront each other and then the PKG substrate 13 is fixed by means of an appropriate tool (not shown) relative to the mother board 16. Then welded soldering material is supplied through a method such as the reflowing between the pads 14 and pads 17 thereby to form the solder bumps 15 providing electric connection between the pads 14 and 17.

It is now apparent from the above-mentioned first embodiment that when the first and second groups of pads 14 and 17 have been treated by different surface treatment processes such as electrolytic and non-electrolytic plating processes respectively, the exposed connection areas of the respective first and second groups of pads are different from each other in size or dimension. When, in other words, the first groups of pads 14 are treated by an electrolytic soldering process and the second group of pads 17 have been treated by a non-electrolytic soldering process, the exposed connection area of each of the pads 14 is smaller than that of the pad 17 so that the adhesion degree between the solder bumps 15 and pads 14 is similar to that between the solder bumps 15 and the pads 17 whereby the adhesion degrees of the solder bumps 15 with the pads 14 and 17 are rather uniform. Therefore, the connection assemblies between substrate 13 and board 16 is durable against possible stresses appearing around the solder bumps 15 because of the different amount of thermal expansions of the substrate 13 and board 16 or against possible shocks caused by dropping of the device including the particular VLSI assembly.

Figure 4A:
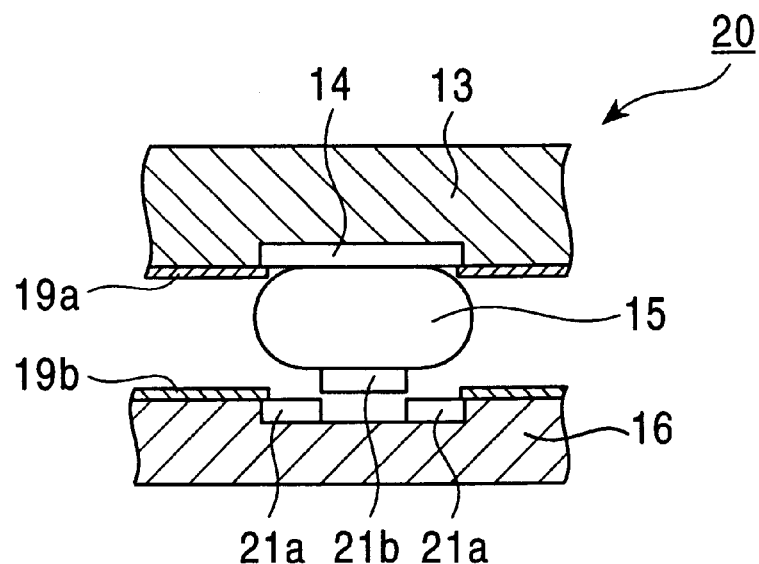
FIGS. 4A and 4B are respectively sectional and partial plan views showing a second embodiment of the present invention.
Figure 4B:
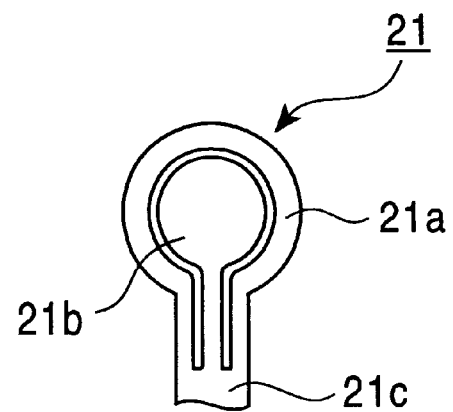

FIG. 4A is a sectional view of an electric connection arrangement of a BGA package assembly of a second embodiment of the present invention. FIG. 4B is a plan view of a pad 21 formed on a major surface of a mother board 16 In FIGS. 4A and 4B, the same reference numerals as in FIGS. 3A and 3B are used for designating counterparts of the assembly of FIGS. 3A and 3B appearing in FIGS. 4A and 4B.

This BGA package assembly 20 of the second embodiment is different from the BGA package assembly 10 of the first embodiment in shape with respect to the mother board I/O pads 21. The former includes a deformable structure.

As seen from FIGS. 4A and 4B, each of the mother board I/O pads 21 of the second embodiment is made of a flat and preferably resilient metal member and includes a fixed part 21a and a tongue part 21b. The fixed part 21a is fastened to the mother board 16 and the resilient tongue part 21b is preferably resiliently connected to the fixed part 21a at an external terminal part 21c. The external terminal part 21c extends further to be integral with a circuit pattern (not shown). The tongue part 21b is separable from the fixed part 21a. Thus, the mother board I/O pads 21 respectively include deformable structure.

In this embodiment, each of the mother board I/O pads 21 is made of a flat metallic member, which is divided into the annular outer part 21a and the circular tongue part 21b. The circular tongue part 21b is separated or separable from the annular outer part 21a through a chemical method such as etching. In this instance, it is to be understood that the solder bump 15 is adhered both to the outer and the inner parts 21a and 21b.

In the second embodiment, the mother board I/O pad 21 includes the tongue part 21b that is separated or separable from the fixed part 21a, and therefore the tongue part 21b can absorb stress or force caused by the terminal expansions of the PKG substrate 13 and mother board 16 or dropping of the BGA package 20. Even when the mother board I/O pad 21 is displaced relative to the PKG I/O pad 14 the electrical connection between the solder bump 15 and tongue part 21b can be kept because the tongue part 21b is peeled off from the mother board 16 and is separated from the outer part 21a, as seen from FIG. 4A.

Figure 5A:
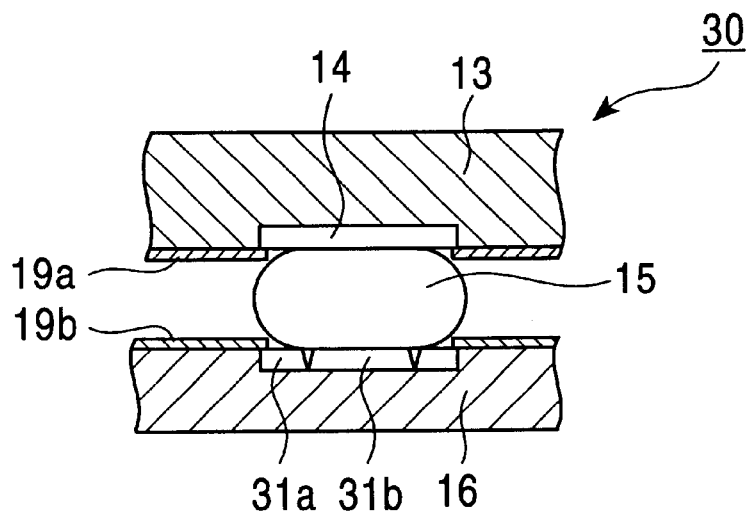
FIGS. 5A and 5B are respectively sectional and partial plan views showing third embodiment of the present invention.
Figure 5B:
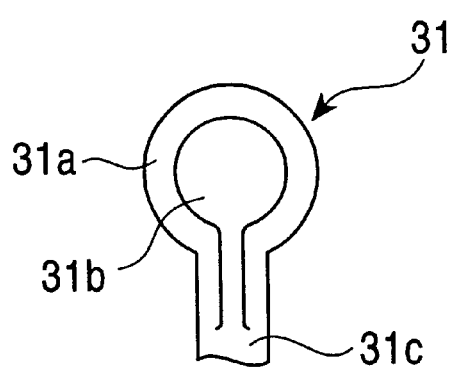

FIG. 5A is a sectional view of a third embodiment of the electrical connection assembly including a solder bump 15 interconnecting the pad 14 formed on the PKG substrate 13 and a mother board I/O pad 31 formed on the mother board 16. In this embodiment, the mother board I/O pad 31 is made of a flat and preferably resilient metal member and includes a fixed part 31a, which is fixed to the mother board 16, and a tongue part 31b which is separated from the fixed part by means of a slit 31d formed therebetween through a mechanical cutting such as the laser cutting but connected to the fixed part 31a only at an external connection part 31c. The external connection part 31c is integral with an external circuit pattern (not shown). Therefore, the tongue part 31b is separated from the fixed part 31a only when the tongue 31b is subjected to a stress.

In this third embodiment, the tongue part 31b is separated from the fixed part 31a because of breakage of the bump 15 in case the electrical connection assembly is subjected to a stress or force because of thermal expansions of the PKG substrate 13 and the mother board 16 under abrupt changes in the environmental temperature or shocks because of dropping of the device, whereby the electrical connection within the electrical connection assembly is kept since the solder bump 15 continues to contact with at least the tongue 31b.

It is now to be understood that the pad 14 on the PKG substrate 13 may be modified to have a similar structure as in the pad 21 or 31, if desired. That is, the pad 14 may be separated or separable into an outer annular part and an inner circular part. The outer annular part is fixed to the substrate 13 while the inner circular part is separated or separable from the outer annular part.

In the third embodiment, the slit 31d is formed by the mechanical cutting such as the laser cutting so as to form the fixed part 31a and tongue part 31b and accordingly the manufacturing process is rather simpler than that for the second embodiment.

Furthermore, a specific treatment may be applied to the surface of the mother board 16 so that the tongue part 31b can be more readily peeled from the mother board 16 than the fixed part 31a.

In the VLSI assembly according to the present invention, the electric connection pad is separable into two parts such as central and peripheral parts so that the central part can be separated from the peripheral part thereby to absorb stresses or forces applied to the assembly.

What is claimed is:

1. A VLSI package assembly, comprising:
A PKG substrate carrying on one major surface thereof an IC chip, and having on another surface thereof a plurality of first connection pads arranged in a two-dimensional format;
a motherboard having a plurality of second connection pads two-dimensionally arranged on one surface thereof confronting said other surface of the PKG structure, each of the first connection pads having a smaller exposed area for soldering than that of the second connection pads, the first pads treated with an electrolytic plating process and the second pads treated with a non-electrolytic plating process; and
a plurality of solder bumps, the pluralities of first and second connection pads and the plurality of solder bumps together defining an electric path assembly including respective opposing ones of the pluralities of first and second connection pads and respective ones of the solder bumps electrically connecting between the opposing first and second connection pads, wherein said electric path assembly includes by itself an anti-stress structure with a high durability against stresses occurring therein.

2. A VLSI package assembly, comprising:

a PKG substrate carrying on one major surface thereof an IC chip, and having on another surface thereof a plurality of first connection pads arranged in a two-dimensional format;

a motherboard having a plurality of second connection pads two-dimensionally arranged on one surface thereof confronting said other surface of the PKG structure, each of the first connection pads having a smaller exposed area for soldering than that of the second connection pads and one of said first and second connection pads includes a resilient flat plate which is partly divided into two pieces, that are separable from each other, and one of which is separable from the surface on which it is mounted; and a plurality of solder bumps, the pluralities of first and second connection pads and the plurality of solder bumps together defining an electric path assembly including respective opposing ones of the pluralities of first and second connection pads and a deformable structure which is deformable in response to a stress exerted thereon, and respective ones of the solder bumps electrically connecting between the opposing first and second connection pads, wherein said electric path assembly includes by itself an anti-stress structure with a high durability against stresses occurring therein.

3. A VLSI package assembly according to claim 2, in which the exposed areas of said first and second pads are respectively circular.

4. A VLSI package assembly according to claim 2, in which said two pieces are a central portion and a peripheral portion surrounding said central portion.

5. A VLSI package assembly according to claim 4, in which said central portion is circular and said peripheral portion is annular.

6. A VLSI package assembly according to claim 2, wherein at least one pad of the first and second pads contains a division, partially separating the one pad into first and second resiliently connected pieces, the first piece being connected to the solder bump more strongly than the second piece.

7. A VLSI package assembly according to claim 2, in which said first or second connection pad is separated into two pieces through mechanical or chemical treatment.

8. A VLSI package assembly according to claim 2, wherein the solder bumps are each connected with both of the two pieces, a part of the solder bump connected with one of the two pieces being breakable in response to a stress exerted thereon.

9. A VLSI package assembly, comprising:

a PKG substrate having a major surface and an other surface;

an IC mounted on the substrate major surface;

a motherboard having one surface confronting the other surface of the PKG substrate; and an electric path assembly, including a two-dimensional array of first connection pads on the other surface of the PKG substrate, a two-dimensional array of second connection pads on the one surface of the motherboard, each of the second connection pads being in opposing relation to a respective one of the first connection pads, one of the first and second connection pads including a resilient flat plate partially divided into two pieces which are separable from each other, one of the two pieces being fixed to one of the motherboard and the substrate, and the other being a tongue part connected with the solder bump and separable from one of the motherboard and the substrate; and an array of solder bumps interposed between the arrays of first and second connections pads so that each solder bump connects a respective pair of opposing first and second connection pads, to define a respective electric current conduit between the substrate and the motherboard, wherein each electric current conduit contains therein an anti-stress structural means for relieving stresses occurring therein.

10. A VLSI package assembly according to claim 9, wherein the anti-stress structural means of each electric current conduit is defined by a division in at least one pad of the first and second pads thereof, partially separating the one pad into first and second resiliently connected parts the first part being connected to the solder bump more strongly than the second part.

11. A VLSI package assembly, comprising:

a PKG substrate carrying on one major surface thereof an IC chip, and having another surface;

a motherboard having one surface confronting the other surface of the PKG substrate;

an electric path assembly, including a plurality of first connection pads arranged in a two-dimensional format on the other surface of the PKG substrate;

a plurality of second connection pads two-dimensionally arranged on the one surface such that each second connection pad opposing a respective one of the first connection pads; and a two-dimensional array of solder bumps arranged between the pluralities of first and second connection pads, such that each solder bump connects a respective pair of opposing first and second connection pads to define a respective electric current conduit between the substrate and the motherboard, wherein each of the second connection pads includes a resilient flat plate which is partially divided into two pieces which are separable from each other, one of the two pieces fixed to said motherboard, the other a tongue part connected with the solder bump and separable from said motherboard thereby to relieve stresses occurring in the electric current conduit.

\* \* \* \* \*